(12) United States Patent
Yano et al.

(10) Patent No.: US 12,115,483 B2
(45) Date of Patent: Oct. 15, 2024

(54) VENTILATION COMPONENT

(71) Applicant: NITTO DENKO CORPORATION, Ibaraki (JP)

(72) Inventors: Youzou Yano, Osaka (JP); Takumi Takahashi, Osaka (JP); Kenichi Nishikawa, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 400 days.

(21) Appl. No.: 17/596,058

(22) PCT Filed: Jun. 2, 2020

(86) PCT No.: PCT/JP2020/021830
§ 371 (c)(1),
(2) Date: Dec. 2, 2021

(87) PCT Pub. No.: WO2020/246481
PCT Pub. Date: Dec. 10, 2020

(65) Prior Publication Data
US 2022/0314150 A1 Oct. 6, 2022

(30) Foreign Application Priority Data
Jun. 7, 2019 (JP) .................... 2019-106826

(51) Int. Cl.
*B01D 46/00* (2022.01)
*B01D 46/54* (2006.01)
*C09J 7/38* (2018.01)

(52) U.S. Cl.
CPC ....... *B01D 46/0005* (2013.01); *B01D 46/543* (2013.01); *C09J 7/38* (2018.01);
(Continued)

(58) Field of Classification Search
None
See application file for complete search history.

(56) References Cited

U.S. PATENT DOCUMENTS

| 2010/0143711 A1* | 6/2010 | Daigaku | C09J 7/385 428/343 |
| 2010/0227544 A1 | 9/2010 | Furuyama et al. | |

(Continued)

FOREIGN PATENT DOCUMENTS

| CN | 103836600 A | 6/2014 |
| CN | 206520574 U | 9/2017 |

(Continued)

OTHER PUBLICATIONS

International Search Report and Written Opinion issued for International Patent Application No. PCT/JP2020/021830, Date of mailing: Aug. 25, 2020, 14 pages including English translation.
(Continued)

*Primary Examiner* — Jason M Greene
(74) *Attorney, Agent, or Firm* — HSML P.C.

(57) ABSTRACT

A ventilation component (1a) includes a supporting portion (10), a gas-permeable membrane (20), and a sealing member (30). The supporting portion (10) has a ventilation path (12) and an annular surface (14). When the ventilation component (1a) is attached to a housing (2), the ventilation path (12) extends in a direction perpendicular to an opening plane of an opening (2a), and extends through the supporting portion (10). The annular surface (14) faces an outer surface (2e) of the housing (2), and surrounds the ventilation path (12) in plan view. The gas-permeable membrane (20) closes the ventilation path (12) in a ventilatable manner. The gas-permeable membrane (20) allows a gas to pass therethrough in a thickness direction of the gas-permeable membrane (20). The sealing member (30) is sandwiched between the outer surface (2e) of the housing (2) and the annular surface (14) to seal a gap between the outer surface (2e) of the housing (2) and the annular surface (14). The sealing member (30) includes at least one selected from the group
(Continued)

consisting of a pressure-sensitive adhesive, an adhesive, and a cured product of an adhesive.

11 Claims, 6 Drawing Sheets

(52) U.S. Cl.
 CPC ...... *B01D 2271/02* (2013.01); *B01D 2279/35* (2013.01); *C09J 2301/302* (2020.08); *C09J 2301/408* (2020.08)

(56) References Cited

U.S. PATENT DOCUMENTS

| | | | |
|---|---|---|---|
| 2011/0016836 A1* | 1/2011 | Yano | H05K 5/0216 55/491 |
| 2011/0223394 A1 | 9/2011 | Daigaku et al. | |
| 2014/0047981 A1 | 2/2014 | Uemura et al. | |
| 2014/0137739 A1 | 5/2014 | Ishii et al. | |
| 2014/0252229 A1 | 9/2014 | Kondo | |
| 2014/0318374 A1* | 10/2014 | Yano | B01D 53/22 96/11 |

FOREIGN PATENT DOCUMENTS

| | | | |
|---|---|---|---|
| JP | 2007186189 | 7/2007 | |
| JP | 2007-201110 | * 8/2007 | ............... H05K 5/06 |
| JP | 2010155973 | 7/2010 | |
| JP | 2012231089 | 11/2012 | |
| JP | 2014123625 A | 7/2014 | |
| JP | 2014173370 A | 9/2014 | |
| JP | 2014173895 A | 9/2014 | |
| JP | 2018082090 | 5/2018 | |
| WO | 2012161099 A1 | 11/2012 | |

OTHER PUBLICATIONS

Office Action issued for Chinese Patent Application No. 202080041437.3, dated Oct. 25, 2022, 16 pages including English machine translation.

Decision of Refusal issued for Japanese Patent Application No. 2019-106826, Dispatch Date: May 16, 2023, 6 pages including English machine translation.

* cited by examiner

VENTILATION COMPONENT

TECHNICAL FIELD

The present invention relates to a ventilation component.

BACKGROUND ART

Conventionally, ventilation components to be attached to a housing having an opening have been known.

For example, Patent Literature 1 describes a ventilation unit including a ventilation member and a sealing member. The ventilation member is attached to an opening of a housing. The ventilation member includes a water-proof sound-transmitting membrane for covering the opening. The sealing member seals a gap between the housing and the ventilation member. The sealing member used is an O-ring. The sealing member further includes a washer. The washer surrounds the sealing member. This prevents a foreign matter from entering the housing from between the ventilation member and the housing in an environment where a high external pressure acts on the ventilation unit.

CITATION LIST

Patent Literature

Patent Literature 1: JP 2012-231089 A

SUMMARY OF INVENTION

Technical Problem

In the ventilation unit described in Patent Literature 1, the O-ring is used as the sealing member, and furthermore the washer is used. The technique described in Patent Literature 1 has room for improving the reliability of the ventilation component with a simple structure. In view of this, the present invention provides a ventilation component that is advantageous in exhibiting a high reliability with a simple structure.

Solution to Problem

The present invention provides a ventilation component to be attached to a housing to cover an opening of the housing, the ventilation component including:
a supporting portion having a ventilation path and an annular surface, the ventilation path extending in a direction perpendicular to an opening plane of the opening when the ventilation component is attached to the housing, the annular surface facing an outer surface of the housing positioned on an outer circumference of the opening, and the annular surface surrounding the ventilation path in plan view;
a gas-permeable membrane closing the ventilation path in a ventilatable manner and allowing a gas to pass therethrough in a thickness direction thereof; and
a sealing member, when the ventilation component is attached to the housing, sandwiched between the outer surface of the housing and the annular surface to seal a gap between the outer surface of the housing and the annular surface, wherein
the ventilation path extends through the supporting portion in the direction perpendicular to the opening plane, and
the sealing member includes at least one selected from the group consisting of a pressure-sensitive adhesive, an adhesive, and a cured product of an adhesive.

Advantageous Effects of Invention

The above ventilation component is advantageous in exhibiting a high reliability with a simple structure.

DESCRIPTION OF EMBODIMENTS

Embodiments of the present invention will be described below with reference to the accompanying drawings. The following description describes examples of the present invention, and the present invention is not limited to the following embodiments.

Figure 1:
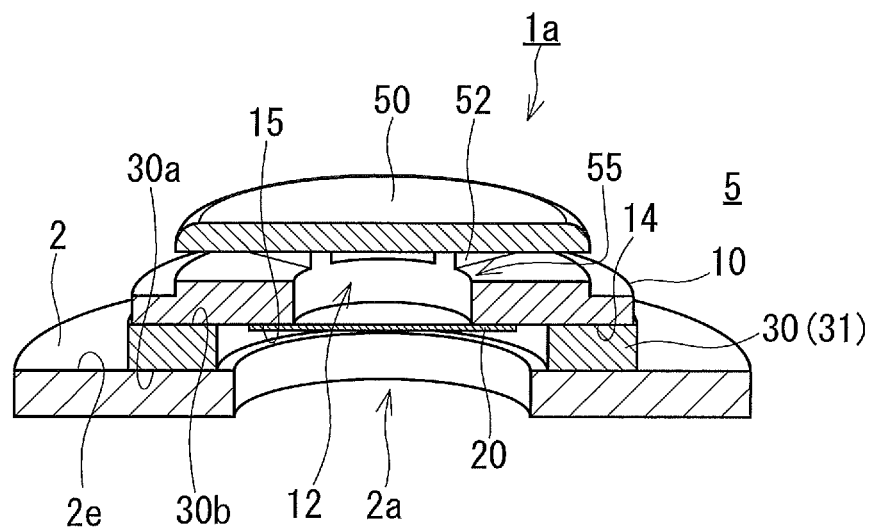
FIG. 1 is a perspective view showing a cross-section of an example of a ventilation component according to the present invention.

As shown in FIG. 1, a ventilation component 1*a* is a component to be attached to a housing 2 to cover an opening 2*a* of the housing 2. The ventilation component 1*a* includes a supporting portion 10, a gas-permeable membrane 20, and a sealing member 30. The supporting portion 10 has a ventilation path 12 and an annular surface 14. When the ventilation component 1*a* is attached to the housing 2, the ventilation path 12 extends in a direction perpendicular to an opening plane of the opening 2*a*, and extends through the supporting portion 10. When the ventilation component 1*a* is attached to the housing 2, the annular surface 14 faces an outer surface 2*e* of the housing 2 positioned on an outer circumference of the opening 2*a*, and surrounds the ventilation path 12 in plan view. The gas-permeable membrane 20 closes the ventilation path 12 in a ventilatable manner. The gas-permeable membrane 20 allows a gas to pass therethrough in a thickness direction of the gas-permeable membrane 20. When the ventilation component 1*a* is attached to the housing 2, the sealing member 30 is sandwiched between the outer surface 2e of the housing 2 and the annular surface 14 to seal a gap between the outer surface 2e of the housing 2 and the annular surface 14. The sealing member 30 includes at least one selected from the group consisting of a pressure-sensitive adhesive, an adhesive, and a cured product of an adhesive. "Pressure-sensitive adhesive" is one type of "adhesive" that is a material exerting an action of adhering an object and an object to each other, and refers to a type exerting an action of adhesion by pressure application. Also, in the present invention, "pressure-sensitive adhesive" is excluded from "adhesive", and "adhesive" refers to a type exerting an action of adhesion mainly by curing. Furthermore, in the present description, the opening plane of the opening 2a refers to a plane defined by a boundary between a surface of the housing 2 defining the opening 2a and the outer surface 2e.

The annular surface 14 is not limited to have a specific shape as long as the annular surface 14 surrounds the ventilation path 12 in plan view. The annular surface 14 may have an annular ring shape, or may have a shape other than an annular ring shape.

The sealing member 30 has a first joining surface 30a that is brought into contact with the outer surface 2e of the housing 2 when the ventilation component 1a is attached to the housing 2. The first joining surface 30a is formed of, for example, at least one selected from the group consisting of a pressure-sensitive adhesive, an adhesive, and a cured product of an adhesive.

The use of an O-ring for sealing a gap between a ventilation component and an outer surface of a housing, like in the technique described in Patent Literature 1, limits the contact area of the O-ring with the outer surface of the housing when the ventilation component is attached to the housing, because the O-ring has a circular cross-section. In addition, in the case where the O-ring is an elastic body, a sufficient sealability might not be achieved depending on the surface roughness of the outer surface of the housing. For example, in the case where the outer surface of the housing is rough and the O-ring has a small contact area with the outer surface of the housing, the O-ring cannot deform in accordance with the unevenness on the outer surface of the housing even by being compressed, and thus a gas such as air or a liquid such as water might leak. In contrast, according to the ventilation component, since the sealing member 30 includes at least one selected from the group consisting of a pressure-sensitive adhesive, an adhesive, and a cured product of an adhesive, the first joining surface 30a is formed of at least one selected from the group consisting of a pressure-sensitive adhesive, an adhesive, and a cured product of an adhesive, for example. This easily increases the contact area between the sealing member 30 and the outer surface 2e of the housing 2 when the ventilation component 1a is attached to the housing 2. For example, compared with a structure in which an O-ring is used as a sealing member in a ventilation component having the same outer diameter, the ventilation component 1 easily has an increased contact area between the sealing member 30 and the outer surface 2e of the housing 2. Accordingly, the corrosion resistance of the housing 2 or components inside the housing 2 can be improved. In addition, the first joining surface 30a is easily formed in accordance with the shape of the outer surface 2e of the housing 2. Accordingly, a gas or a liquid is less likely to leak, and thus the ventilation component 1a can exhibit a high reliability. Moreover, the ventilation component 1a does not need a member such as the washer in the ventilation unit described in Patent Literature 1, and has a simple structure.

The sealing member 30 has an outer circumferential portion that is less likely to form a recess between the outer circumferential portion and the outer surface 2e of the housing 2, and thus a liquid is less likely to collect at a position in contact with the outer circumferential portion of the sealing member 30. This can prevent deterioration of the housing 2 or the sealing member 30.

The sealing member 30 generates a smaller stress (repulsive force) due to being sandwiched between the annular surface 14 and the outer surface 2e of the housing 2 than an O-ring, and thus the load on the housing 2 can be reduced. The sealing member 30 does not need to be compressed unlike an O-ring, and thus the precision required for processing of the housing 2 can be relaxed. In addition, the ventilation component 1a can be manufactured at a lower cost than the case where an O-ring is used as the sealing member. In addition, compared with the case where an O-ring is used as the sealing member, dimensions of the ventilation component 1a in the direction perpendicular to the opening plane of the opening 2a of the housing 2 can be easily reduced, and dimensions of a portion protruding from the housing 2 toward the outside of the housing 2 in the ventilation component 1a can be reduced. Also, dimensions of a portion protruding from the housing 2 toward the inside of the housing 2 in the ventilation component 1a can be reduced. Furthermore, the thickness of a plate forming the housing 2 can be reduced.

The sealing member 30 has for example a second joining surface 30b in contact with the annular surface 14. The second joining surface 30b is formed of, for example, at least one selected from the group consisting of a pressure-sensitive adhesive, an adhesive, and a cured product of an adhesive.

Figure 2A:
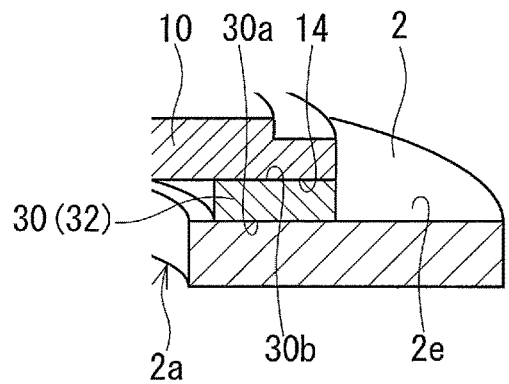
FIG. 2A is a perspective view showing a portion of a cross-section of a modification of the ventilation component shown in FIG. 1.
Figure 2B:
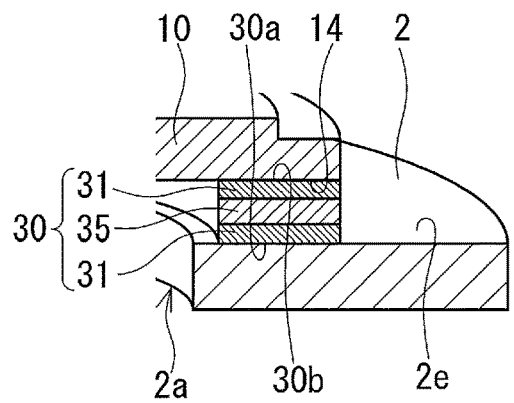
FIG. 2B is a perspective view showing a portion of a cross-section of another modification of the ventilation component shown in FIG. 1.
Figure 2C:
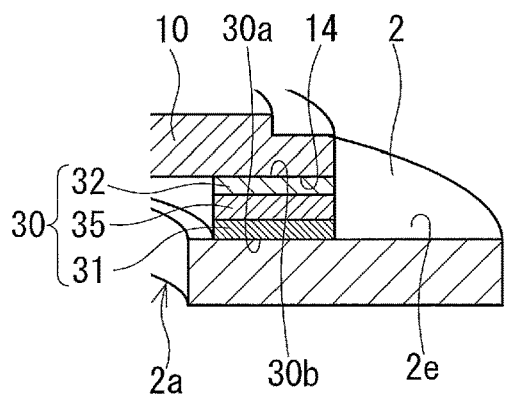
FIG. 2C is a perspective view showing a portion of a cross-section of still another modification of the ventilation component shown in FIG. 1.
Figure 2D:
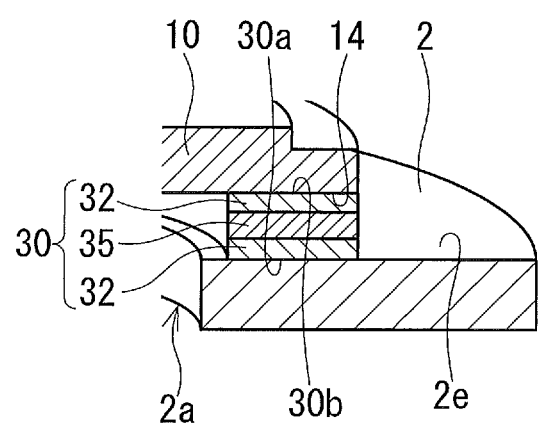
FIG. 2D is a perspective view showing a portion of a cross-section of still another modification of the ventilation component shown in FIG. 1.

As shown in FIG. 1, the sealing member 30 is composed of for example a single layer of a pressure-sensitive adhesive 31. In contrast, as shown in FIG. 2A, the sealing member 30 may be composed of a single layer of an adhesive 32. As shown in FIG. 2B, the sealing member 30 may be composed of a base material 35 and two layers of the pressure-sensitive adhesive 31 that are formed on both surfaces of the base material 35. As shown in FIG. 2C, the sealing member 30 may be composed of the base material 35, the pressure-sensitive adhesive 31 that is formed on one of principal surfaces of the base material 35 and forms the first joining surface 30a, and the adhesive 32 that is formed on the other principal surface of the base material 35 and forms the second joining surface 30b. As shown in FIG. 2D, the sealing member 30 may be composed of the base material 35 and two layers of the adhesive 32 that are formed on the both surfaces of the base material 35.

In the case where the sealing member 30 includes the pressure-sensitive adhesive 31, the pressure-sensitive adhesive 31 is not particularly limited. The pressure-sensitive adhesive 31 typically includes a base polymer. The base polymer can be, for example, a base polymer in a known acrylic pressure-sensitive adhesive, rubber pressure-sensitive adhesive, vinyl alkyl ether pressure-sensitive adhesive, silicone pressure-sensitive adhesive, polyester pressure-sensitive adhesive, polyimide pressure-sensitive adhesive, urethane pressure-sensitive adhesive, fluorine pressure-sensitive adhesive, or epoxy pressure-sensitive adhesive.

The pressure-sensitive adhesive 31 includes, for example, at least one selected from the group consisting of a filler, air bubbles, and a surfactant. Accordingly, the adhesiveness, cohesiveness, and flexibility of the pressure-sensitive adhesive 31 are easily adjusted to a desired state. The thickness of the layer formed of the pressure-sensitive adhesive 31 is for example 1.0 to 2.0 mm.

The pressure-sensitive adhesive 31 includes for example a filler. Accordingly, a stress in peeling off of the pressure-sensitive adhesive 31 is distributed, and thus the pressure-sensitive adhesive 31 easily has a high adhesiveness.

The filler is not particularly limited as long as a desired adhesiveness can be imparted to the pressure-sensitive adhesive 31. The filler includes for example hollow particles. Accordingly, a stress in peeling off of the pressure-sensitive adhesive 31 is more reliably distributed, and thus the pressure-sensitive adhesive 31 easily has a high adhesiveness.

The material forming the hollow particles as the filler in the pressure-sensitive adhesive 31 may be an inorganic material, or may be an organic material. The inorganic material forming the hollow particles is for example glass, a metal oxide such as alumina, or a ceramic. In the present description, metal oxides include silica. The inorganic material forming the hollow particles is for example an acrylic resin or a vinylidene chloride resin.

The hollow particles for example have a spherical shape. The average particle diameter of the hollow particles is not particularly limited. The average particle diameter of the hollow particles is for example 1 to 500 μm, and may be 5 to 200 μm, or may be 10 to 100 μm. The average particle diameter of the hollow particles can be determined as follows, for example. With respect to 50 or more hollow particles included in the pressure-sensitive adhesive 31, observation is performed with an optical microscope or an electron microscope to determine the maximum diameter of each of the hollow particles. Then, the arithmetic mean value of the maximum diameters of the hollow particles is calculated, and the calculated arithmetic mean value is determined as the average particle diameter of the hollow particles.

The density of the hollow particles is not particularly limited. The density of the hollow particles is for example 0.1 to 0.8 g/cm$^3$, and may be 0.12 to 0.5 g/cm$^3$. Owing to the density of the hollow particles being 0.1 g/cm$^3$ or more, the hollow particles are easily dispersed uniformly in the pressure-sensitive adhesive 31. Owing to the density of the hollow particles being 0.8 g/cm$^3$ or less, the manufacturing cost of the pressure-sensitive adhesive 31 is easily lowered.

The content of the filler in the pressure-sensitive adhesive 31 is not particularly limited. The content of the filler in the pressure-sensitive adhesive 31 is for example 5 to 50 volume %, and may be 10 to 50 volume %, or 15 to 40 volume %, with respect to the total volume of the pressure-sensitive adhesive 31. Owing to the content of the filler in the pressure-sensitive adhesive 31 being 5 volume % or more, a stress in peeling off of the pressure-sensitive adhesive 31 is easily and more reliably distributed. Owing to the content of the filler in the pressure-sensitive adhesive 31 being 50 volume % or less, a decrease in adhesive force of the pressure-sensitive adhesive 31 can be suppressed.

The pressure-sensitive adhesive 31 may further include air bubbles in addition to the filler. Accordingly, a stress in peeling off of the pressure-sensitive adhesive 31 is more reliably distributed, and thus the pressure-sensitive adhesive 31 easily has a high adhesiveness. In addition, the cohesiveness and flexibility of the pressure-sensitive adhesive 31 are easily adjusted, and thus the processability of the pressure-sensitive adhesive 31 and the resilience of the pressure-sensitive adhesive 31 are easily enhanced.

The content of the air bubbles in the pressure-sensitive adhesive 31 is not particularly limited. The content of the air bubbles in the pressure-sensitive adhesive 31 is for example 5 to 50 volume %, and may be 5 to 40 volume %, or 5 to 30 volume %, with respect to the total volume of the pressure-sensitive adhesive 31. Owing to the content of the air bubbles in the pressure-sensitive adhesive 31 being 5 volume % or more, when the pressure-sensitive adhesive 31 deforms by stress, the pressure-sensitive adhesive 31 easily returns to its state before deformation, and thus can exhibit a desired resilience. Owing to the content of the air bubbles in the pressure-sensitive adhesive 31 being 50 volume % or less, the air bubbles can be prevented from passing through the layer formed of the pressure-sensitive adhesive 31, and thus the pressure-sensitive adhesive 31 can easily exhibit a high adhesiveness. In addition, the pressure-sensitive adhesive 31 can be prevented from becoming excessively soft, and the pressure-sensitive adhesive 31 easily exhibits a desired resistance against a shearing force.

The air bubbles in the pressure-sensitive adhesive 31 are desirably closed cells. In the pressure-sensitive adhesive 31, open cells and closed cells may be mixed together.

The air bubbles in the pressure-sensitive adhesive 31 for example have a spherical shape. The air bubbles in the pressure-sensitive adhesive 31 may have a distorted spherical shape. The average diameter of the air bubbles in the pressure-sensitive adhesive 31 is not particularly limited. The average diameter of the air bubbles in the pressure-sensitive adhesive 31 is for example 1 to 1000 μm, and may be 10 to 500 μm, or 30 to 300 μm. The average diameter of the air bubbles can be determined as follows, for example. The average bubble diameter can be calculated typically by arithmetically averaging measurement results obtained using a scanning electron microscope (SEM) for the diameters of preferably 10 or more air bubbles. At this time, non-spherical air bubbles are converted into spherical air bubbles having an equivalent volume to calculate the average bubble diameter.

A gas component included in the air bubbles in the pressure-sensitive adhesive 31 is not particularly limited. The gas component included in the air bubbles is for example an inert gas such as nitrogen, carbon dioxide, and argon, and air. When a reaction such as a polymerization reaction is performed after formation of the air bubbles in the pressure-sensitive adhesive 31, it is desirable that the gas component included in the air bubbles should not inhibit the reaction. From the viewpoint of not inhibiting the reaction and of the manufacturing cost and so on, the gas component included in the air bubbles is desirably nitrogen.

In the case where the pressure-sensitive adhesive 31 includes a filler, the pressure-sensitive adhesive 31 may be substantially free of air bubbles. In this case, the pressure-sensitive adhesive 31 easily exhibits a high resistance against a shearing force. Being substantially free of air bubbles means, for example, that the content of the air bubbles in the pressure-sensitive adhesive 31 is less than 5% with respect to the total volume of the pressure-sensitive adhesive 31.

The pressure-sensitive adhesive 31 may further include for example a surfactant in addition to the filler. This decreases the adhesion between the filler and the base polymer, and thus easily causes a wide distribution of stress in the pressure-sensitive adhesive 31. As a result, the pressure-sensitive adhesive 31 easily deforms in accordance with the shape of an adherend surface, and thus easily exhibits a high adhesiveness.

The surfactant included in the pressure-sensitive adhesive 31 is not particularly limited. The surfactant is for example a fluorine surfactant. The fluorine surfactant has, for example, an oxyalkylene group and a fluorinated hydrocarbon group. The oxyalkylene group easily decreases the adhesion and friction resistance between the filler and the base polymer, and thus easily causes a wide distribution of stress in the pressure-sensitive adhesive 31. The fluorinated hydrocarbon group easily decreases the friction resistance between the filler and the base polymer. In addition, in the case where the pressure-sensitive adhesive 31 includes air bubbles, the mixing property of the air bubbles and the stability of the air bubbles are easily enhanced. The fluorine surfactant is for example a nonionic surfactant. In this case, the fluorine surfactant easily has a good dispersion property relative to the base polymer.

The oxyalkylene group of the fluorine surfactant is represented by —R—O—. R is a linear or branched alkylene group having 2 or 3 carbon atoms. The fluorine surfactant for example has at least one of an oxyethylene group (—CH$_2$CH$_2$O—) and an oxypropylene group [—CH$_2$CH(CH$_3$)O—]. An oxygen atom at the terminal of the oxyalkylene group may be bonded to a hydrogen atom to constitute an alcohol. An oxygen atom at the terminal of the oxyalkylene group may be bonded to another hydrocarbon group to constitute an ether. An oxygen atom at the terminal of the oxyalkylene group may be bonded to another hydrocarbon group via a carbonyl group to constitute an ester. The structure including the oxyalkylene group may be a cyclic structure such as cyclic ethers or lactones.

The fluorinated hydrocarbon group of the fluorine surfactant is not particularly limited. The fluorinated hydrocarbon group is for example a perfluoro group. The perfluoro group may be monovalent one, or may be polyvalent one with a valency of 2 or more. Also, the fluorinated hydrocarbon group may have a double bond or a triple bond, and may have a straight chain structure, a branched chain structure, or a cyclic structure. The number of carbon atoms in the fluorinated hydrocarbon group is not particularly limited. The number of carbon atoms in the fluorinated hydrocarbon group is for example 1 or 2 or more, and may be 3 to 30, or 4 to 20.

The structure of the fluorine surfactant is not limited to a specific structure. The fluorine surfactant is for example a copolymer of a monomer having an oxyalkylene group and a monomer having a fluorinated hydrocarbon group. The copolymer may be a block copolymer, or may be a graft copolymer.

The base polymer included in the pressure-sensitive adhesive 31 is desirably an acrylic polymer. The acrylic polymer is for example an acrylic polymer derived from (meth) acrylic acid ester as a monomer. In the acrylic polymer, (meth)acrylic acid alkyl ester can be desirably used. (Meth) acrylic acid alkyl ester for example has alkyl including 1 to 20 carbon atoms. (Meth)acrylic acid alkyl esters are, for example, methyl (meth)acrylate, ethyl (meth)acrylate, propyl (meth)acrylate, isopropyl (meth)acrylate, butyl (meth) acrylate, isobutyl (meth)acrylate, s-butyl (meth)acrylate, t-butyl (meth)acrylate, pentyl (meth)acrylate, isopentyl (meth)acrylate, hexyl (meth)acrylate, heptyl (meth)acrylate, octyl (meth)acrylate, 2-ethylhexyl (meth)acrylate, isooctyl (meth)acrylate, nonyl (meth)acrylate, isononyl (meth)acrylate, decyl (meth)acrylate, isodecyl (meth)acrylate, undecyl (meth)acrylate, dodecyl (meth)acrylate, tridecyl (meth)acrylate, tetradecyl (meth)acrylate, pentadecyl (meth)acrylate, hexadecyl (meth)acrylate, heptadecyl (meth)acrylate, octadecyl (meth)acrylate, nonadecyl (meth)acrylate, or eicosyl (meth)acrylate. In the acrylic polymer, (meth)acrylic acid ester having an alicyclic hydrocarbon group may be used. (Meth)acrylic acid ester having an alicyclic hydrocarbon group is, for example, cyclopentyl (meth)acrylate, cyclohexyl (meth)acrylate, or isobolonyl (meth)acrylate.

The use amount of the (meth)acrylic acid ester in the acrylic polymer is for example 60 weight % or more, and desirably 80 weight % or more, with respect to the total amount of a monomer for preparing the base polymer.

In the acrylic polymer, a copolymerizable monomer such as a polar group-containing monomer or a polyfunctional monomer may be used as a monomer component. The use of the copolymerizable monomer for example enhances the adhesiveness to an adherend, and thus enhances the cohesive force of the pressure-sensitive adhesive 31. In the acrylic polymer, a single type of copolymerizable monomer may be used, or two or more types of copolymerizable monomers may be used.

Examples of the polar group-containing monomers include: a carboxyl group-containing monomer such as (meth)acrylic acid, itaconic acid, maleic acid, fumaric acid, crotonic acid, and isocrotonic acid, or a monomer containing an anhydride of the carboxyl group such as maleic anhydride; a hydroxyl group-containing monomer such as hydroxyalkyl (meth)acrylate including hydroxyethyl (meth) acrylate, hydroxypropyl (meth)acrylate, and hydroxybutyl (meth)acrylate; an amide group-containing monomer such as acrylamide, methacrylamide, N,N-dimethyl (meth)acrylamide, N-methylol (meth)acrylamide, N-methoxymethyl (meth)acrylamide, and N-butoxymethyl (meth)acrylamide; an amino group-containing monomer such as aminoethyl (meth)acrylate, dimethylaminoethyl (meth)acrylate, and t-butylaminoethyl (meth)acrylate; a glycidyl group-containing monomer such as glycidyl (meth)acrylate and methylglycidyl (meth)acrylate; a cyano group-containing monomer such as acrylonitrile and methacrylonitrile; a heterocyclic vinyl monomer such as N-vinyl-2-pyrrolidone, (meth)acryloylmorpholine, N-vinylpyridine, N-vinylpiperidone, N-vinylpyrimidine, N-vinylpiperazine, N-vinylpyrrole, N-vinylimidazole, and N-vinyloxazole. Preferred as the polar group-containing monomer is a carboxyl group-containing monomer such as acrylic acid or its anhydride.

The use amount of the polar group-containing monomer is for example 30 weight % or less, and may be 1 to 30 weight %, or 2 to 30 weight %, with respect to the total amount of a monomer for preparing the base polymer. This easily maintains the cohesive force of the pressure-sensitive adhesive 31 at an appropriate level. Also, the pressure-sensitive adhesive 31 easily exhibits a high resistance against a shearing force.

The polyfunctional monomer is, for example, hexanediol (meth)acrylate, (poly)ethylene glycol di(meth)acrylate, (poly)propylene glycol di(meth)acrylate, neopentyl glycol di(meth)acrylate, pentaerythritol di(meth)acrylate, pentaerythritol tri(meth)acrylate, dipentaerythritol hexa(meth) acrylate, trimethylolpropane tri(meth)acrylate, tetramethylolmethane tri(meth)acrylate, allyl (meth)acrylate, vinyl (meth)acrylate, divinylbenzene, epoxy acrylate, polyester acrylate, urethane acrylate, dibutyl (meth)acrylate, or hexidyl (meth)acrylate.

The use amount of the polyfunctional monomer is for example 2 weight % or less, and may be 0.01 to 2 weight %, or 0.02 to 1 weight %, with respect to the total amount of a monomer for preparing the base polymer. This easily maintains the cohesive force of the pressure-sensitive adhesive 31 at an appropriate level.

Other copolymerizable monomers usable in preparing the base polymer is, for example: vinyl esters such as vinyl acetate and vinyl propionate, aromatic vinyl compounds such as styrene vinyl toluene, olefins such as ethylene, butadiene, isoprene, and isobutylene, or dienes; vinyl ethers such as vinyl alkyl ether; vinyl chloride; alkoxyalkyl (meth) acrylate monomers such as methoxyethyl (meth)acrylate and ethoxyethyl (meth)acrylate; sulfonic acid group-containing monomers such as sodium vinyl sulfonate; phosphate group-containing monomers such as 2-hydroxyethyl acryloyl phosphate; imide group-containing monomers such as cyclohexylmaleimide and isopropylmaleimide; isocyanate group-containing monomers such as 2-methacryloyloxyethyl isocyanate; fluorine atom-containing (meth)acrylates; or silicon atom-containing (meth)acrylates.

The pressure-sensitive adhesive 31 may further include at least one selected from the group consisting of a cross-linking agent, a tackifier, an antioxidant, a plasticizer, and a colorant, as necessary.

In the case where the sealing member 30 includes the adhesive 32, the adhesive 32 is not particularly limited. A known adhesive can be used as the adhesive 32. The adhesive 32 can be, for example, an epoxy resin adhesive, a silicone resin adhesive, a vinyl resin adhesive, a hot melt adhesive, or a cyanoacrylate adhesive. In the case where the adhesive 32 is a hot melt adhesive, the adhesive 32 may be a hot melt sheet. The hot melt adhesive is not limited to a specific hot melt adhesive. The hot melt adhesive may be a polyamide hot melt adhesive, a polyurethane hot melt adhesive, a polyester hot melt adhesive, an olefin hot melt adhesive, or a hot melt adhesive including thermoplastic polyimide. Examples of the hot melt sheet include Elphan (registered trademark) PH-413 manufactured by Nihon Matai CO., Ltd. and Midfil (registered trademark), thermoplastic polyimide film, manufactured by Kurabo Industries Ltd.

In the case where the sealing member 30 includes the base material 35, the base material 35 can be, for example, a fiber base material, a plastic base material, a metal base material, a rubber base material, a foam, or a laminate of these. The fiber base material is, for example, a cloth, a non-woven cloth, or a net. The metal base material is for example a metal foil or a metal plate. The rubber base material is for example a rubber sheet. The laminate may be a laminate of a plastic base material and other base material, or may be a laminate of plastic films. A plastic material included in the plastic base material is, for example, an olefin resin having α-olefin as a monomer component, such as polyethylene (PE), polypropylene (PP), ethylene-propylene copolymer, or ethylene-vinyl acetate copolymer (EVA). The plastic material may be a polyester resin such as polyethylene terephthalate (PET), polyethylene naphthalate (PEN), or polybutylene terephthalate (PBT); polyvinyl chloride (PVC); vinyl acetate resin; polyphenylene sulfide (PPS); polyamide (nylon); amide resin such as aromatic polyamide (aramid); polyimide resin; or polyether ether ketone (PEEK). In the base material 35, a single type of plastic material may be used, or two or more types of plastic materials may be used.

The thickness of the base material 35 is not limited to a specific thickness. The thickness of the base material 35 is for example 1000 μm or less, and may be 1 to 1000 μm, 1 to 500 μm, or 3 to 300 μm.

As shown in FIG. 1, the supporting portion 10 has for example an adherend surface 15. The adherend surface 15 faces the opening 2a when the ventilation component 1a is attached to the housing 2. The gas-permeable membrane 20 is for example attached to the adherend surface 15. In this case, the gas-permeable membrane 20 is less likely to come into direct contact with an object outside the ventilation component 1a. Accordingly, the gas-permeable membrane 20 is likely to be protected appropriately.

The gas-permeable membrane 20 is not limited to any particular gas-permeable membrane as long as it has a desired gas-permeability. The gas-permeable membrane 20 may be a single layer membrane, or may be a multilayer membrane. In the case where the gas-permeable membrane 20 is a multilayer membrane, each layer thereof can be one selected from the group consisting of a porous membrane, a nonwoven fabric, a cloth, and a mesh. The gas-permeable membrane 20 may include: a porous membrane and a nonwoven fabric; at least one of a cloth and a mesh, and a porous membrane; or a plurality of nonwoven fabrics. Typically, the gas-permeable membrane 20 is composed of an organic polymer material (resin). The material of the porous membrane is for example fluororesin. Examples usable as the fluororesin include polytetrafluoroethylene (PTFE), polychlorotrifluoroethylene, a tetrafluoroethylene-hexafluoropropylene copolymer, and a tetrafluoroethylene-ethylene copolymer. Examples of a material of each of the nonwoven fabric, the cloth, and the mesh include polyester such as polyethylene terephthalate, polyolefin such as polyethylene and polypropylene, nylon, aramid, and an ethylene-vinyl acetate copolymer.

The gas-permeable membrane 20 includes for example an extended PTFE porous membrane. In this case, the extended PTFE porous membrane may be layered on a gas-permeable supporting member such as a nonwoven fabric.

The gas-permeable membrane 20 may be subject to a liquid-repellant treatment as necessary. The liquid-repellant treatment is performed for example by forming, on the gas-permeable membrane 20, a liquid-repellant coating film containing a fluorine surface modifier having a perfluoroalkyl group. Formation of the liquid-repellant coating film is not limited to any particular formation method. The formation may be performed for example by coating a resin porous membrane with a solution or dispersion of a fluorine surface modifier having a perfluoroalkyl group with a method such as an air spray method, an electrostatic spray method, a dip coating method, a spin coating method, a roll coating method, a curtain flow coating method, or an impregnation method. The liquid-repellant coating film may be formed by an electrodeposition method or a plasma polymerization method.

The gas-permeable membrane 20 is for example adhered to the adherend surface 15. The gas-permeable membrane 20 may be welded to the adherend surface 15. The gas-permeable membrane 20 may be attached to the adherend surface 15 with a double-sided adhesive tape.

As shown in FIG. 1, the ventilation component 1a for example further includes a roof portion 50. The roof portion 50 is coupled to the supporting portion 10, and covers the gas-permeable membrane 20 when the gas-permeable membrane 20 is viewed in plan. In addition, the roof portion 50 forms, between the roof portion 50 and the gas-permeable membrane 20, a gap 55 communicating with an external space 5 of the ventilation component 1a.

The supporting portion 10 is for example plate-like and annular. The roof portion 50 is for example plate-like. The roof portion 50 is coupled to the supporting portion 10 by a rib 52. For example, a plurality of the ribs 52 are formed at predetermined intervals around an axis of the supporting portion 10. The gap 55 is thus formed. Also, the gap 55 communicates with the external space 5 through spaces between the ribs 52.

The supporting portion 10 and the roof portion 50 are for example integrally molded. The supporting portion 10 and the roof portion 50 may be molded as separate bodies and assembled to each other.

As shown in FIG. 1, the ventilation component 1a for example does not have a portion protruding beyond the first joining surface 30a. In other words, the ventilation component 1a does not have a portion to be inserted into the opening 2a of the housing 2. Accordingly, the ventilation component 1a can be attached to the housing 2 with no presence of a portion of the ventilation component 1a inside the opening 2a. A portion of the ventilation component 1a is not brought into contact with the housing 2 in the opening 2a, and thus attachment of the ventilation component 1a to the housing 2 is easy.

The ventilation component 1a can be modified from various perspectives. For example, the ventilation component 1a may be modified to a ventilation component 1b shown in FIG. 3, a ventilation component 1c shown in FIG. 4, a ventilation component 1d shown in FIG. 5, a ventilation component 1e shown in FIG. 6, or a ventilation component 1f shown in FIG. 7. The ventilation components 1b to 1f are each configured in the same manner as the ventilation component 1a except portions particularly otherwise described. Respective constituent elements of the ventilation components 1b to 1f that are identical to or correspond to those of the ventilation component 1a are indicated by the same reference numerals, and detailed descriptions thereof will be omitted. The description given for the ventilation component 1a is applicable to each of the ventilation components 1b to 1f unless there is a technical inconsistency.

Figure 3:
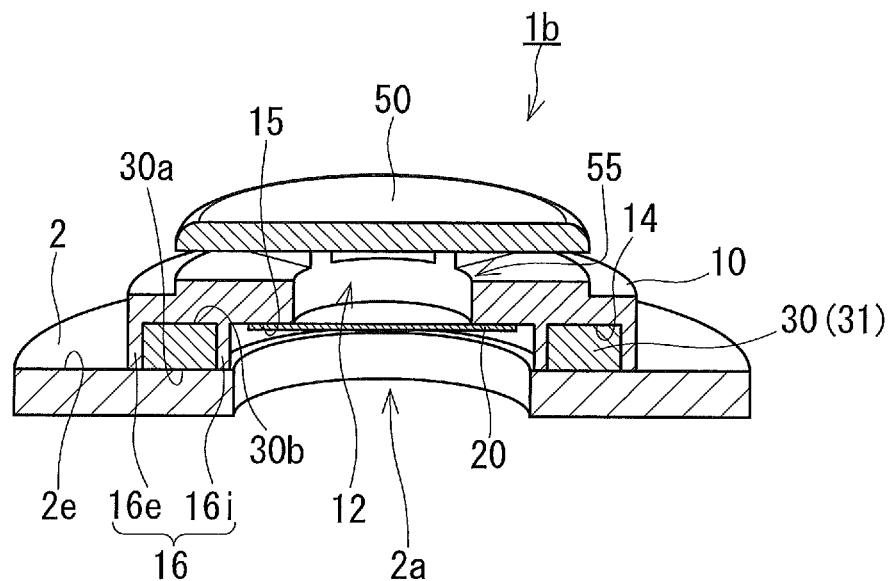
FIG. 3 is a perspective view showing a cross-section of another example of the ventilation component according to the present invention.

As shown in FIG. 3, in the ventilation component 1b, the supporting portion 10 has a first positioning portion 16. The first positioning portion 16 suppresses at least one of movement of the sealing member 30 toward the ventilation path 20 and movement of the sealing member 30 away from the ventilation path 20. Owing to the first positioning portion 16, movement of the sealing member 30 can be suppressed. Accordingly, the sealing member 30 is disposed at an appropriate position when the ventilation component 1b is attached to the housing 2, and thus the ventilation component 1b can exhibit a high reliability.

The first positioning portion 16 is defined, for example, by an annular protruding portion extending toward the first joining surface 30. The first positioning portion 16 for example has an inner protruding portion 16i and an outer protruding portion 16e. The inner protruding portion 16i suppresses movement of the sealing member 30 toward the ventilation path 20, and the outer protruding portion 16e suppresses movement of the sealing member 30 away from the ventilation path 20. One of the inner protruding portion 16i and the outer protruding portion 16e may be omitted.

Figure 4:
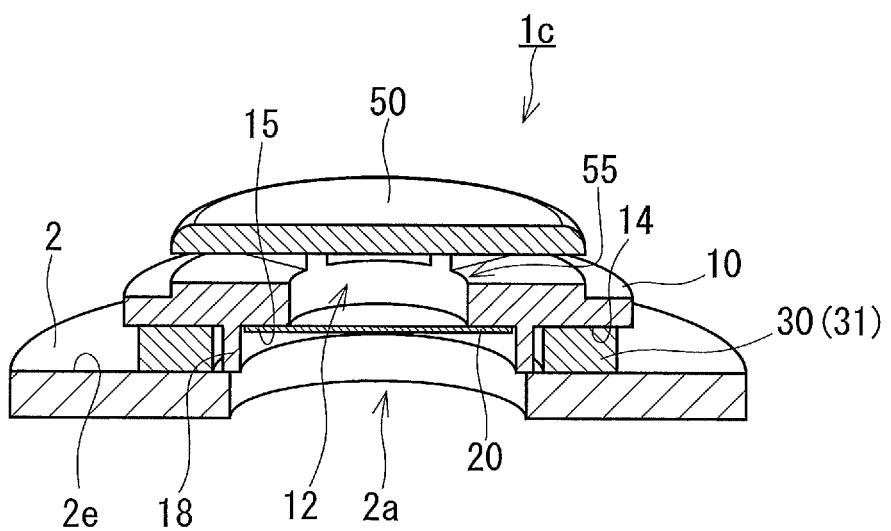
FIG. 4 is a perspective view showing a cross-section of still another example of the ventilation component according to the present invention.

As shown in FIG. 4, in the ventilation component 1c, the supporting portion 10 has a second positioning portion 18. The second positioning portion 18 suppresses movement of the gas-permeable membrane 20 in a direction parallel to a surface of the gas-permeable membrane 20. Accordingly, the gas-permeable membrane 20 is disposed at an appropriate position, and thus the ventilation component 1c can exhibit a high reliability. The second positioning portion 18 is for example a tubular protruding portion and surrounds the gas-permeable membrane 20.

Figure 5:
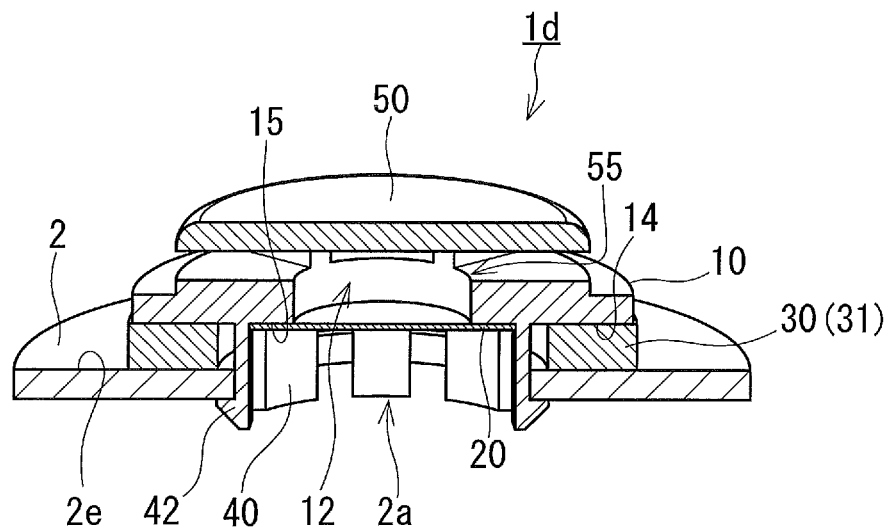
FIG. 5 is a perspective view showing a cross-section of still another example of the ventilation component according to the present invention.

As shown in FIG. 5, the ventilation component 1d further includes a protruding portion 40. The protruding portion 40 protrudes in a direction perpendicular to the opening plane of the opening 2a. When the ventilation component 1d is attached to the housing 2, the protruding portion 40 is inserted into the opening 2a to be brought into contact with the housing 2 in the opening 2a. The ventilation path 12 extends through the supporting portion 10 and the protruding portion 40 in the direction perpendicular to the opening plane of the opening 2a. When the ventilation component 1d is attached to the housing 2, the protruding portion 40 can be used for positioning the ventilation component 1d, and thus the ventilation component 1d can be appropriately attached to the housing 2. Accordingly, the ventilation component 1d can exhibit a high reliability.

As shown in FIG. 5, the protruding portion 40 for example has a locked portion 42. The locked portion 42 is locked to the housing 2. This appropriately positions the ventilation component 1d relative to the housing 2. The locked portion 42 is locked to the housing 2 by for example snap-fitting. The locked portion 42 for example has a claw facing an inner surface of the housing 2 when the ventilation component 1d is attached to the housing 2. This prevents the ventilation component 1d from moving away from the housing 2 when the ventilation component 1d is attached to the housing 2. The locked portion 42 may be locked to the housing 2 by screwing, or may be locked to the housing 2 with a bayonet.

In the ventilation component 1d, the protruding portion 40 for example has a plurality of leg portions, and slits are formed between the plurality of leg portions.

Figure 6:
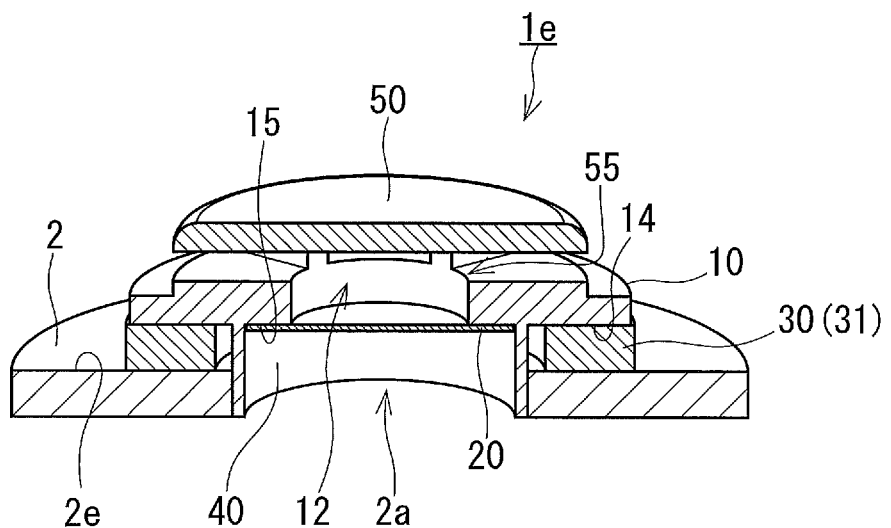
FIG. 6 is a perspective view showing a cross-section of still another example of the ventilation component according to the present invention.

As shown in FIG. 6, the ventilation component 1e further includes the protruding portion 40 in the same manner as the ventilation component 1d. In the protruding portion 40 of the ventilation component 1e, however, the locked portion 42 is omitted. In addition, in the ventilation component 1e, the protruding portion 40 has a tubular shape. Accordingly, a foreign matter is less likely to enter the housing 2. The protruding portion 40 is for example in contact with the housing 2, in the opening 2a, entirely around a straight line perpendicular to the opening plane of the opening 2a. The protruding portion 40 may be in partial contact with the housing 2, in the opening 2a, around the straight line perpendicular to the opening plane of the opening 2a.

Figure 7:
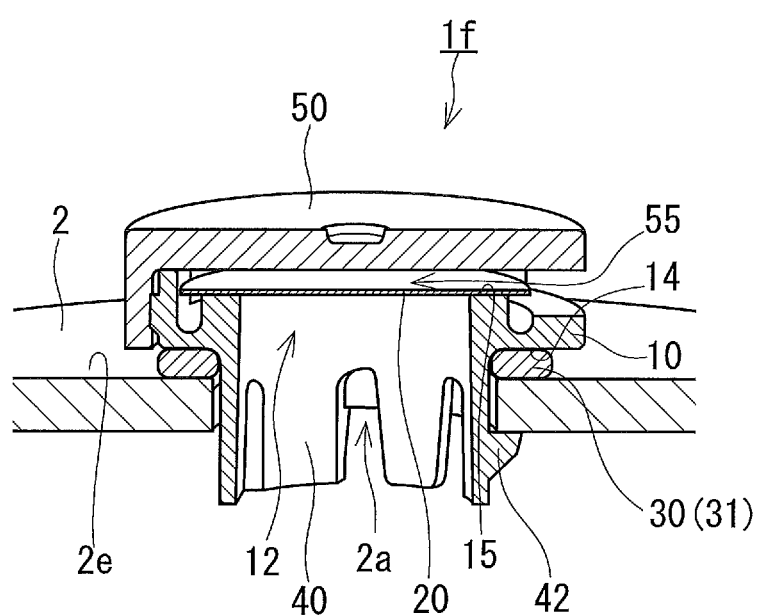
FIG. 7 is a perspective view showing a cross-section of still another example of the ventilation component according to the present invention.

As shown in FIG. 7, in the ventilation component 1f, the supporting portion 10 has the adherend surface 15. The adherend surface 15 faces in the same direction as a direction in which the outer surface 2e of the housing 2 faces when the ventilation component 1f is attached to the housing 2. The gas-permeable membrane 20 is attached to the adherend surface 15. In this case, the gas-permeable membrane 20 is disposed near the outside of the ventilation component 1f, and thus the state of the gas-permeable membrane 20 is easily checked. Accordingly, the ventilation component 1f is advantageous from the viewpoint of maintenance.

The invention claimed is:

1. A ventilation component configured to be attached to a housing to cover an opening of the housing, the ventilation component comprising:
   a supporting portion having a ventilation path and an annular surface, the ventilation path extending in a direction perpendicular to an opening plane of the opening when the ventilation component is attached to the housing, the annular surface being configured to face an outer surface of the housing positioned on an outer circumference of the opening, and the annular surface surrounding the ventilation path in plan view;
   a gas-permeable membrane closing the ventilation path in a ventilatable manner and allowing a gas to pass therethrough in a thickness direction thereof; and
   a sealing member, when the ventilation component is attached to the housing, being configured to be sandwiched between the outer surface of the housing and the annular surface to seal a gap between the outer surface of the housing and the annular surface, wherein the ventilation path extends through the supporting portion in the direction perpendicular to the opening plane, the sealing member includes a pressure-sensitive adhesive including at least one selected from the group consisting of a filler, air bubbles, and a surfactant, and the sealing member seals the gap without being compressed when the ventilation component is attached to the housing.

2. The ventilation component according to claim 1, wherein the pressure-sensitive adhesive includes the filler.

3. The ventilation component according to claim 2, wherein the pressure-sensitive adhesive further includes the air bubbles.

4. The ventilation component according to claim 2, wherein the filler includes hollow particles.

5. The ventilation component according to claim 1, wherein the supporting portion has an adherend surface, the adherend surface facing the opening when the ventilation component is attached to the housing, and the gas-permeable membrane is attached to the adherend surface.

6. The ventilation component according to claim 1, wherein the supporting portion has an adherend surface, the adherend surface facing in the same direction as a direction in which the outer surface of the housing faces when the ventilation component is attached to the housing, and the gas-permeable membrane is attached to the adherend surface.

7. The ventilation component according to claim 1, wherein the supporting portion has a first positioning portion suppressing at least one of movement of the sealing member toward the ventilation path and movement of the sealing member away from the ventilation path.

8. The ventilation component according to claim 1, wherein the supporting portion has a second positioning portion suppressing movement of the gas-permeable membrane in a direction parallel to a surface of the gas-permeable membrane.

9. The ventilation component according to claim 1, further comprising a protruding portion protruding from the supporting portion in the direction perpendicular to the opening plane, the protruding portion being inserted into the opening to be brought into contact with the housing in the opening when the ventilation component is attached to the housing, wherein the ventilation path extends through the supporting portion and the protruding portion in the direction perpendicular to the opening plane.

10. The ventilation component according to claim 9, wherein the protruding portion has a locked portion to be locked to the housing.

11. The ventilation component according to claim 1, further comprising a roof portion coupled to the supporting portion, the roof portion covering the gas-permeable membrane when the gas-permeable membrane is viewed in plan, and forming, between the roof portion and the gas-permeable membrane, a gap communicating with an external space of the ventilation component.

* * * * *